US009967639B2

(12) United States Patent
FallHowe

(10) Patent No.: US 9,967,639 B2
(45) Date of Patent: May 8, 2018

(54) PORTABLE MINIATURE AMPLIFIER AND SPEAKER FOR GUITAR

(71) Applicant: Bruce Wayne FallHowe, Colorado Springs, CO (US)

(72) Inventor: Bruce Wayne FallHowe, Colorado Springs, CO (US)

( * ) Notice: Subject to any disclaimer, the term of this patent is extended or adjusted under 35 U.S.C. 154(b) by 0 days. days.

(21) Appl. No.: 15/496,695

(22) Filed: Apr. 25, 2017

(65) Prior Publication Data

US 2017/0318366 A1 Nov. 2, 2017

Related U.S. Application Data

(60) Provisional application No. 62/328,460, filed on Apr. 27, 2016.

(51) Int. Cl.

| | |
|---|---|
| ***H04R 1/02*** | (2006.01) |
| ***H04R 3/04*** | (2006.01) |
| ***G10H 3/18*** | (2006.01) |
| ***G10G 7/00*** | (2006.01) |
| ***H03F 3/183*** | (2006.01) |

(52) U.S. Cl.

CPC ............... *H04R 1/025* (2013.01); *G10G 7/00* (2013.01); *G10H 3/186* (2013.01); *H03F 3/183* (2013.01); *H04R 3/04* (2013.01); *G10H 2210/155* (2013.01); *H03F 2200/03* (2013.01); *H04R 2201/028* (2013.01); *H04R 2420/09* (2013.01)

(58) Field of Classification Search

CPC ............... G10H 3/18; G10H 3/00; G10H 1/32
USPC .................................. 381/334, 74, 118, 120
See application file for complete search history.

(56) References Cited

U.S. PATENT DOCUMENTS

| | | | | |
|---|---|---|---|---|
| 5,018,204 A * | 5/1991 | Christian | G10H 1/32 | 381/118 |
| 2007/0180976 A1* | 8/2007 | Demsey | G10H 1/40 | 84/315 |
| 2011/0069849 A1* | 3/2011 | Borden | G10H 1/32 | 381/120 |
| 2015/0036858 A1* | 2/2015 | Aboabdo | H04R 1/02 | 381/334 |

* cited by examiner

*Primary Examiner* — Melur Ramakrishnaiah
(74) *Attorney, Agent, or Firm* — Dale J. Ream

(57) ABSTRACT

A portable miniature sound amplifying apparatus for use with an electric guitar having a guitar jack, includes a body, an electric sound amplifying device positioned in the interior space of the body, and a guitar plug in electrical communication with the electric sound amplifying device that includes a male configuration for selectively mating with the guitar jack of the electric guitar. A speaker is mounted to the electric sound amplifying device and may be directionally articulated and is configured to receive and emit sound data from the guitar via the guitar plug. One or more stabilizer arms may be pivotally coupled to the sound amplifying device and positioned to protect a guitar from being damaged thereby.

10 Claims, 6 Drawing Sheets

PORTABLE MINIATURE AMPLIFIER AND SPEAKER FOR GUITAR

REFERENCE TO RELATED APPLICATIONS

This application claims the benefit of provisional application U.S. Ser. No. 62/328,460, filed Apr. 27, 2016 entitled Portable Guitar Mini Amplifier Speaker System said application being incorporated in its entirety.

BACKGROUND OF THE INVENTION

This invention relates generally to electric sound amplifier for boosting sound from electric musical instruments and, more particularly, to an electric sound amplifier and speaker apparatus configured for direct connection to an electric guitar of a type having an amplifier or speaker jack.

Traditionally, electric guitars are plugged into large and heavy speaker-amplifier combinations (such as in a home, school, or studio environment) or into an amplifier electrically connected to a network of speakers (such as at a concert). The guitar includes a plug and the amplifier includes a socket and the two are electrically connected with a long cord or, more recently, wirelessly.

It is well known that amplifiers and speakers are very bulky, heavy, and awkward to move around without the effort of two or more people and, sometimes, assistive equipment. Various devices have been proposed and used in the art for moving heavy and awkward amplifier and speakers so that the guitarist has a degree of mobility to be able to play the guitar at locations remote from the home or studio. For instance, heavy amplifiers may be moved by the efforts of two or more people, with a dolly or hand truck, or by hauling it in the back of a pickup truck. In the end, lengthy extension cords may be needed and some desired locations to play the guitar may simply become inaccessible altogether. Alternatively, guitars with a built-in amplifier and speaker requires a user to potentially buy a guitar he does not really want (this recognizes that guitarist are often very particular to a brand or style of guitar). Although presumably effective for their intended purposes, the traditional means for moving heavy amplifier-speaker combinations requires an undesirable amount of time, advance planning, and personnel.

Therefore, it would be desirable to have a portable and miniature amplifier speaker system that is configured to be plugged into and attached directly to an electric guitar and, as a result, is ready to amplify and emit sound anywhere the guitar is played. Further, it would be desirable to have a portable and miniature amplifier speaker system having a speaker member that may be articulated to emit sound in a desired direction relative to the guitar, such as in the direction of an audience. In addition, it would be desirable to have a portable and miniature amplifier speaker system having structures that protect the guitar itself against damage from the directly connected amplifier-speaker.

SUMMARY OF THE INVENTION

A portable miniature sound amplifying apparatus according to the present invention for use with an electric guitar having a guitar jack, includes a body, an electric sound amplifying device positioned in the interior space of the body, and a guitar plug in electrical communication with the electric sound amplifying device that includes a male configuration for selectively mating with the guitar jack of the electric guitar. A speaker is mounted to the electric sound amplifying device and may be directionally articulated and is configured to receive and emit sound data from the guitar via the guitar plug. One or more arms may be pivotally coupled to the sound amplifying device and positioned to protect a guitar from being damaged thereby.

Therefore, a general object of this invention is to provide a portable and miniature amplifier speaker apparatus that is configured to be plugged into and attached directly to an electric guitar without cables or wireless components.

Another object of this invention is to provide a portable and miniature amplifier speaker apparatus, as aforesaid, having stabilizer arms that may be positioned to minimize the risk of damage when the apparatus is coupled to a guitar.

Still another object of this invention is to provide a portable and miniature amplifier speaker system, as aforesaid, having a speaker that may be articulated vertically and swiveled horizontally.

Other objects and advantages of the present invention will become apparent from the following description taken in connection with the accompanying drawings, wherein is set forth by way of illustration and example, embodiments of this invention.

DESCRIPTION OF THE PREFERRED EMBODIMENT

Figure 1:
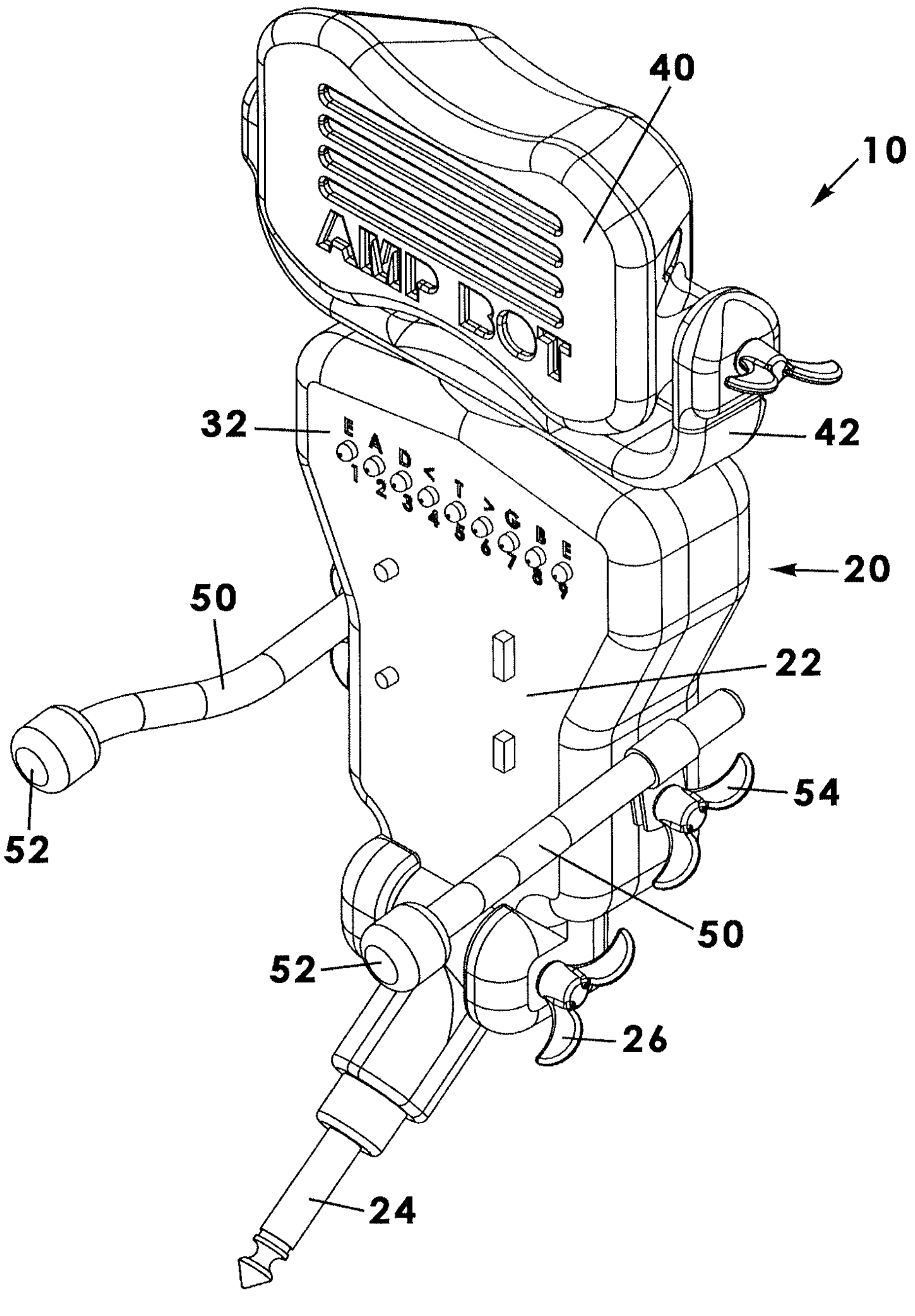
FIG. 1 is a perspective view of a portable miniature sound amplifying apparatus according to a preferred embodiment of the present invention.
Figure 2:
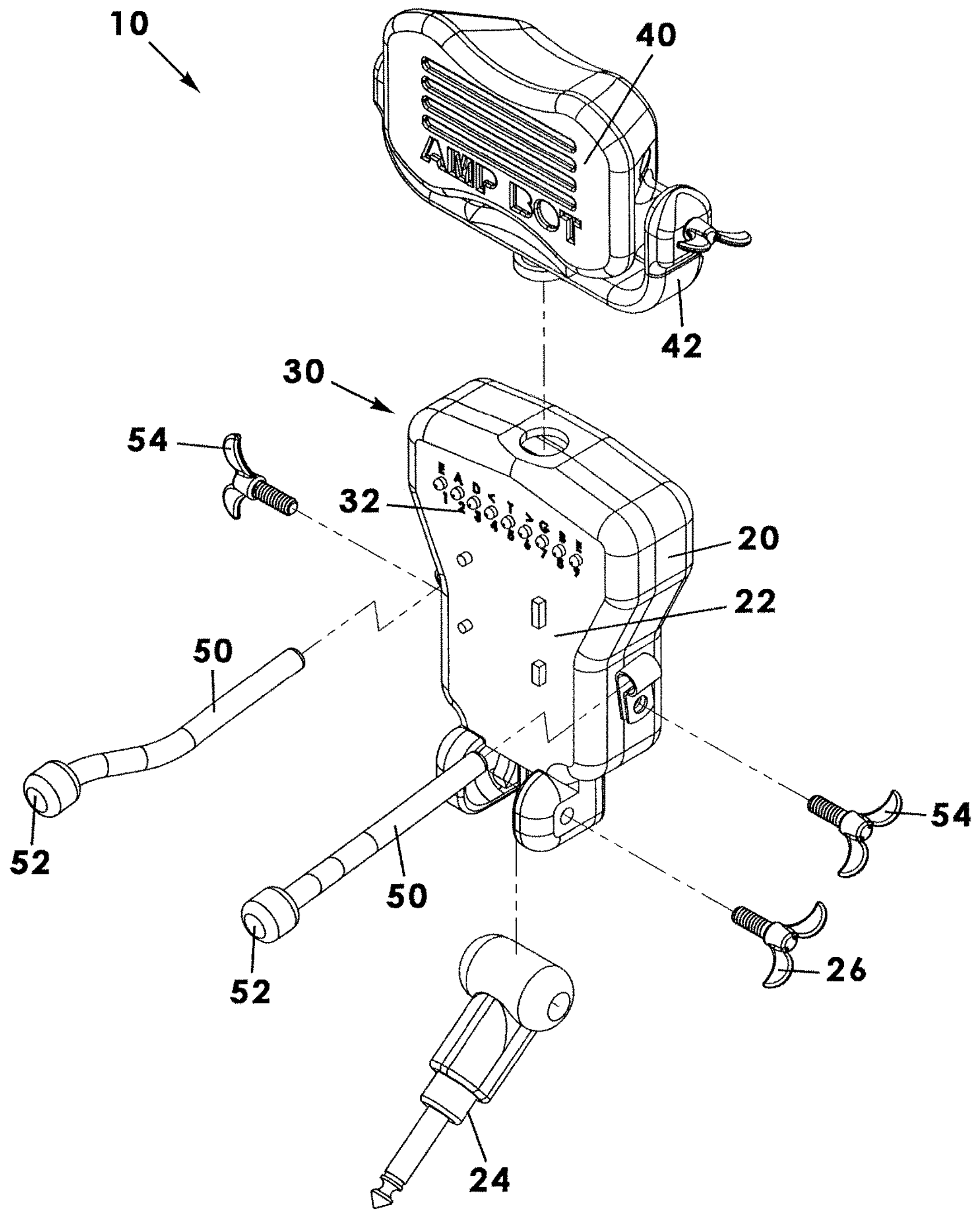
FIG. 2 is an exploded view of the sound amplifying device as in FIG. 1.
Figure 3A:
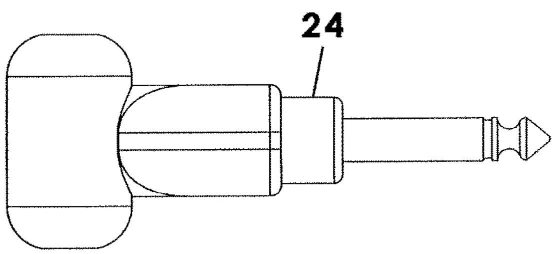
FIG. 3*a* is a top view of a guitar plug as in FIG. 2.
Figure 3B:
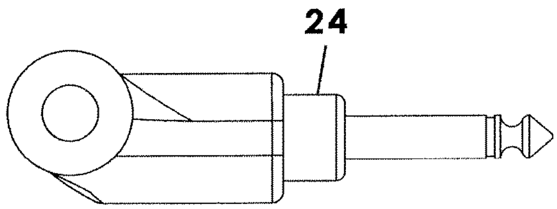
FIG. 3*b* is a side view of the guitar plug as in FIG. 3*a;*
Figure 3C:
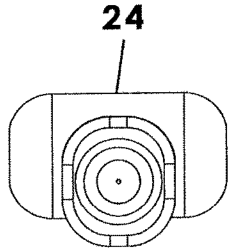
FIG. 3*c* is an end view of the guitar plug as in FIG. 3*a;*
Figure 4A:
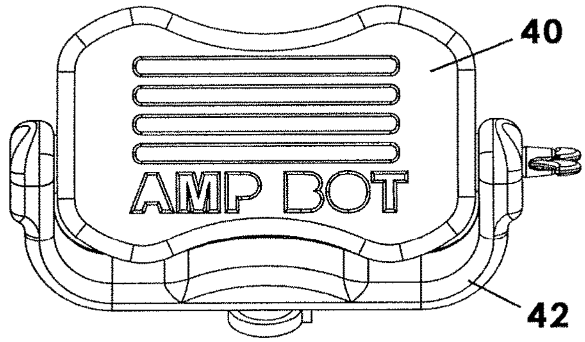
FIG. 4*a* is a front view of a speaker and mounting assembly taken from FIG. 2.
Figure 4B:
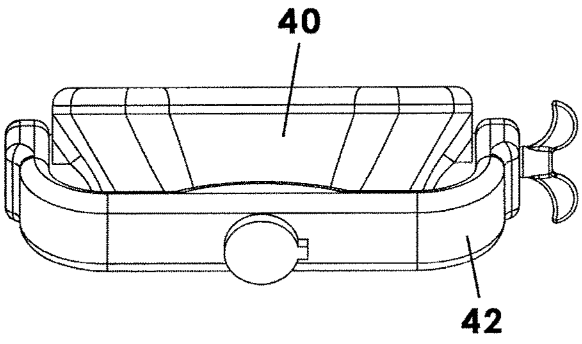
FIG. 4*b* is a top view of the speaker as in FIG. 4*a;*
Figure 4C:
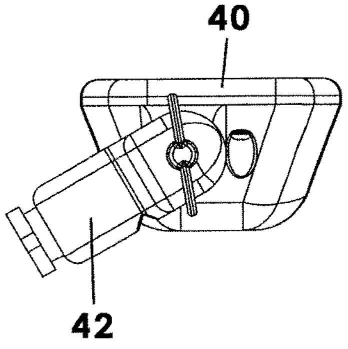
FIG. 4*c* is a side view of the speaker as in FIG. 4*a;*
Figure 5A:
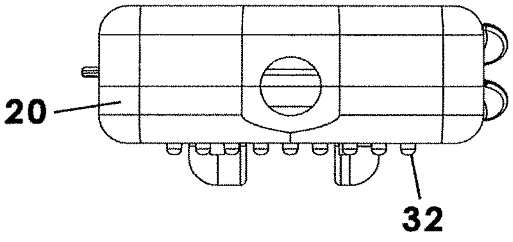
FIG. 5*a* is a top view of a body of the sound amplifying device as in FIG. 2.
Figure 5B:
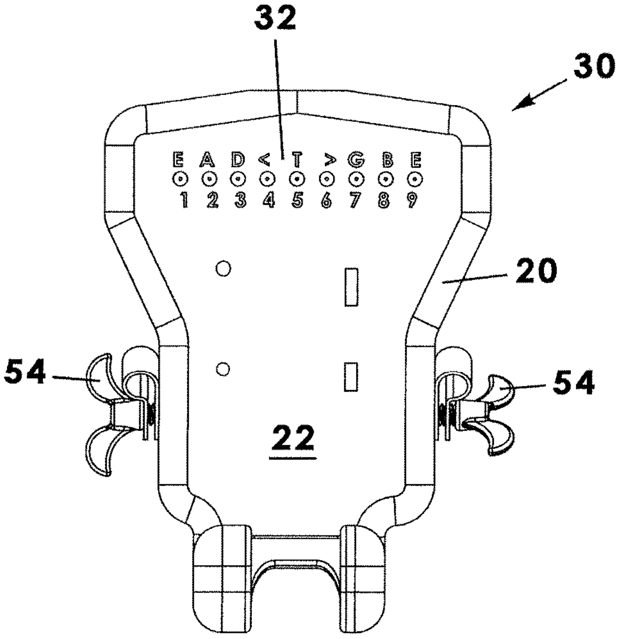
FIG. 5*b* is a front view of the body as in FIG. 5*a;*
Figure 5C:
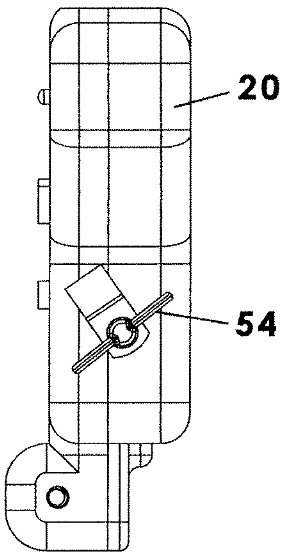
FIG. 5*c* is a side view of the body as in FIG. 5*b*.
Figure 5D:
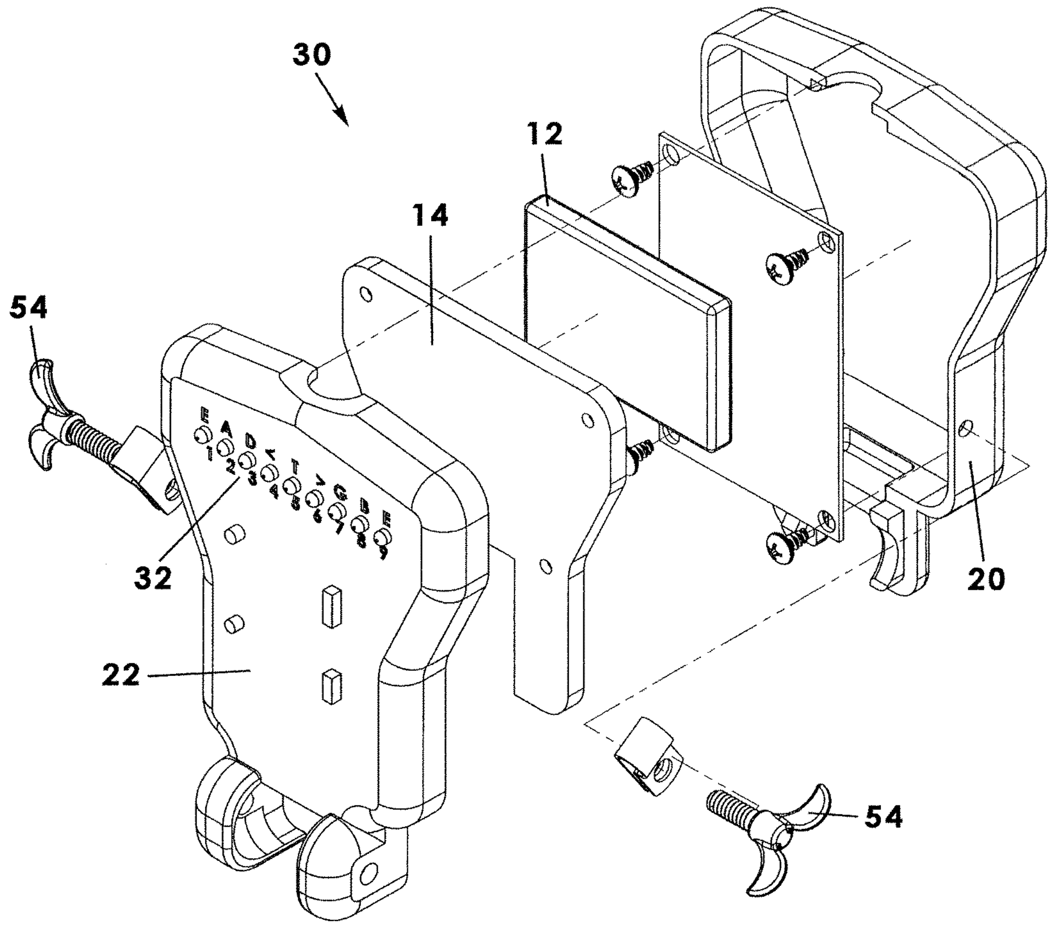
FIG. 5*d* is an exploded view of the body as in FIG. 5*b*.

A portable miniature sound amplifying apparatus according to a preferred embodiment of the present invention will now be described in detail with reference to FIGS. 1 to 5*d* of the accompanying drawings. The portable miniature sound amplifying apparatus 10 includes a body 20, an electric sound amplifying device 30, a guitar plug 24, and a speaker 40 mounted atop the body 20.

The body 20 of the portable miniature sound amplifying apparatus 10 is a housing having a plurality of walls defining an interior space for holding electronic components. More particularly, the body 20 may include a front wall 22 on which amplifier control switches 32 and buttons are accessible to a user, a back wall for contact with the face of a guitar body, and various side walls. The body 20 may include a shape configuration resembling that of a robot and may be marketed as the "AMPBOT™" although other configurations would also work.

The electric and electronic components of an electric sound amplifying device 30 may be positioned in the interior space of the body 20 of the portable miniature sound amplifying apparatus 10. It is understood that the components may be miniaturized or simply minimized in quantity in order to fit within the body 20 of the present apparatus 10 which will be coupled directly to the body of a guitar in use. The electric sound amplifying device 30, however, has all of the functionality of a traditional amplifier, i.e. is capable of receiving analog sound data from a guitar and amplify it for emission from a speaker. Special effects to the sound may also be possible by using the amplifier control switches 32. The control switches 32 may include tuning controls enabling the guitar to be tuned properly before being played. The switches 32 may be electrically connected to a circuit board 14 having the components of a typical amplifier device.

Preferably, the guitar plug 24 is mounted to a lower portion of the body 20 and presents a male configuration configured for reception by a guitar jack of an electric guitar (not shown). It is understood that all electric guitars include a guitar jack into which an electric sound amplifier may be plugged. In operation, sound data is electrically communicated from the input means of the guitar (strings and fret board) to the amplifier and then on to emission via a speaker. In the present invention, it is considered critically important that the guitar plug 24 be mounted to the body 20 in a manner centered between respective side walls as shown in FIG. 1. This enables the portable miniature sound amplifying apparatus 10 to be weight-balanced when connected to an electric guitar. If imbalanced, the musician may also become imbalanced and have a negative influence on his playing or cause damage to the guitar itself. The guitar plug 24 may be pivotally mounted to the body 20 with a plug fastener 26 that can be tightened or loosened, thus allowing the guitar plug 24 to be rotated as may be appropriate to accommodate use with various models of guitars.

A battery 12 may be positioned within the interior space of the body 20 and is electrically connected to the electric amplifier device 30, including the circuit board 14 described above and to the speaker 40. The body 20 may include a battery access door so that the battery 12 may be replaced as needed. In one embodiment, the battery 12 may include a plug and be rechargeable.

The speaker 40 may be mounted to the body 20 in a manner that allows it to be articulated in one or more directions, thus enabling a musician to direct sound toward an audience. More particularly, the speaker 40 may be mounted to an intermediate bracket 42 that is then directly coupled to a top wall or other portion of the body 20. The bracket 42 may be configured to allow the speaker 40 to pivot vertically (i.e. tilt up or down) or to swivel horizontally (i.e. swivel left or right). The speaker 40 itself is electrically connected to the electric sound amplifying device 30 and configured to emit sound according to sound data received from the electric sound amplifying device 30.

In another aspect of the invention, the electric sound amplifying device 30 may include one or a pair of stabilizer arms 50, each stabilizer arm 50 having a proximal end pivotally coupled to an exterior wall of the body 20. Each stabilizer arm 50 may have a generally linear configuration and, in some embodiments, may be length adjustable. Further, each stabilizer arm 50 is pivotally movable between a first configuration perpendicular to and extending forwardly of the front wall 22 of the body 20 and a second configuration offset from the first configuration. A distal end of the stabilizer arm 50 includes a nub 52 which may be constructed of a rubber material (e.g. a rubber cap) unlikely to scratch or damage a surface of the guitar.

When the guitar plug 24 is mated with the jack of a guitar, the body 20 will be in close proximity to the body of the guitar. To minimize risk of damage, one or both of the stabilizer arms 50 is pivoted into contact with the face of the guitar to provide stability, balance, and bumper-like protection against scratches. Further, each stabilizer arm 50 may be pivotally coupled to a side wall of the body 20 such as with an arm fastener 54 for tightening or loosening the movement of the respective arm 50.

In use, the guitar plug 24 may be plugged into the traditional guitar jack so that the entire portable miniature sound amplifying apparatus 10 is coupled to the guitar. Accordingly, amplified sound may be emitted through the integrated speaker 40 whenever and wherever the guitar is played—such as in remote locations not conducive to the use of large and bulky conventional amplifier equipment.

It is understood that while certain forms of this invention have been illustrated and described, it is not limited thereto except insofar as such limitations are included in the following claims and allowable functional equivalents thereof.

The invention claimed is:

1. A portable miniature sound amplifying apparatus for an electric guitar having a guitar jack, said sound amplifying apparatus comprising:

- a body having a plurality of walls that, together, define an interior space;
- an electric sound amplifying device positioned in said interior space of the body;
- a guitar plug in electrical communication with said electric sound amplifying device that includes a male configuration for selectively mating with the guitar jack of the electric guitar;
- wherein said electric sound amplifying device is configured to receive sound data from the guitar via said guitar plug;
- a speaker coupled to said electric sound amplifying device that selectively receives and emits said sound data when energized;
- a battery in electrical communication with said electric sound amplifying device;
- a stabilizing arm having a proximal end pivotally coupled to an exterior wall of said body and a distal end opposed to said distal end, said stabilizing arm being rotatably movable between a first configuration perpendicular to and extending forwardly of said body and a second configuration offset from said first configuration and that includes a nub.

2. The portable miniature sound amplifying apparatus as in claim 1, wherein said nub is constructed of a rubber material that does not cause damage to a surface of the guitar when deployed to the second configuration.

3. The portable miniature sound amplifying apparatus as in claim 1, wherein said nub is selectively movable to bear against a front surface of the guitar when said guitar plug is operatively coupled to said guitar jack of the guitar.

4. The portable miniature sound amplifying apparatus as in claim 1, wherein said stabilizing arm is length adjustable.

5. The portable miniature sound amplifying apparatus as in claim 1, wherein said body includes a battery compartment configured to hold said battery.

6. The portable miniature sound amplifying apparatus as in claim 1, wherein said amplifying device includes a plurality of tuning controls and a plurality of affects controls.

7. The portable miniature sound amplifying apparatus as in claim 1, wherein said speaker is pivotally coupled to a top of said body so that said speaker is selectively articulated between upward, downward, and level configurations.

8. The portable miniature sound amplifying apparatus as in claim 1, wherein said speaker is rotatably coupled to a top of said body so that said speaker is selectively swiveled between left, right, and straight configurations.

9. The portable miniature sound amplifying apparatus as in claim 1, wherein said guitar plug is centered between left and right side walls of said plurality of walls of said body so that said body is balanced.

10. The portable miniature sound amplifying apparatus as in claim 1, wherein said guitar plug is pivotally coupled to a lower end of said body.

* * * * *